United States Patent
Wiatr et al.

(10) Patent No.: US 8,298,924 B2
(45) Date of Patent: Oct. 30, 2012

(54) METHOD FOR DIFFERENTIAL SPACER REMOVAL BY WET CHEMICAL ETCH PROCESS AND DEVICE WITH DIFFERENTIAL SPACER STRUCTURE

(75) Inventors: Maciej Wiatr, Dresden (DE); Frank Wirbeleit, Freiberg (DE); Andy Wei, Dresden (DE); Andreas Gehring, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 718 days.

(21) Appl. No.: 11/866,491

(22) Filed: Oct. 3, 2007

(65) Prior Publication Data

US 2008/0203486 A1  Aug. 28, 2008

(30) Foreign Application Priority Data

Feb. 28, 2007  (DE) .......... 10 2007 009 916

(51) Int. Cl.
*H01L 27/092* (2006.01)
*H01L 21/04* (2006.01)
(52) U.S. Cl. .......... 438/510; 257/369; 257/E21.04; 257/E21.219; 257/E21.636; 257/E21.64; 257/E27.062; 438/745
(58) Field of Classification Search .......... 438/153, 438/188, 199–233, 510; 257/369
See application file for complete search history.

(56) References Cited

U.S. PATENT DOCUMENTS

| 5,766,991 | A | 6/1998 | Chen .............. 438/231 |
| 6,281,062 | B1* | 8/2001 | Sanchez .............. 438/217 |
| 6,512,273 | B1* | 1/2003 | Krivokapic et al. .......... 257/369 |
| 7,064,396 | B2* | 6/2006 | Chen et al. .............. 257/369 |
| 7,303,962 | B2* | 12/2007 | Chou et al. .............. 438/275 |
| 2005/0287823 | A1 | 12/2005 | Ramachandran et al. ..... 438/791 |
| 2006/0249794 | A1 | 11/2006 | Teh et al. .............. 257/369 |
| 2007/0001233 | A1* | 1/2007 | Schwan et al. .............. 257/369 |
| 2007/0111420 | A1* | 5/2007 | Chou et al. .............. 438/199 |
| 2007/0141775 | A1* | 6/2007 | Teo et al. .............. 438/231 |

FOREIGN PATENT DOCUMENTS

| DE | 102004036142 | 2/2006 |
| DE | 102004052578 | 5/2006 |

OTHER PUBLICATIONS

Office Action for DE 10 2007 009 916.0-33 dated Oct. 23, 2006.

* cited by examiner

*Primary Examiner* — David Vu
*Assistant Examiner* — Jonathan Han
(74) *Attorney, Agent, or Firm* — Williams, Morgan & Amerson, P.C.

(57) ABSTRACT

By removing an outer spacer of a transistor element, used for the formation of highly complex lateral dopant profiles, prior to the formation of metal silicide, employing a wet chemical etch process, it is possible to position a stressed contact liner layer more closely to the channel region, thereby allowing a highly efficient stress transfer mechanism for creating a corresponding strain in the channel region, without affecting circuit elements in the P-type regions.

13 Claims, 7 Drawing Sheets

METHOD FOR DIFFERENTIAL SPACER REMOVAL BY WET CHEMICAL ETCH PROCESS AND DEVICE WITH DIFFERENTIAL SPACER STRUCTURE

BACKGROUND OF THE INVENTION

1. Field of the Invention

Generally, the present disclosure relates to the field of integrated circuits, and, more particularly, to the manufacture of spacers for NMOS and PMOS transistors and stressed dielectric layers formed above the transistors.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, renders the channel length a dominant design criterion for accomplishing an increase in the operating speed of the integrated circuits.

The reduction of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

Irrespective of the technological approach used, sophisticated spacer techniques are necessary to create the highly complex dopant profile and to serve as a mask in forming metal silicide regions in the gate electrode and the drain and source regions in a self-aligned fashion. Since the continuous size reduction of the critical dimensions, i.e., the gate length of the transistors, necessitates the adaptation and possibly the new development of process techniques concerning the above-identified process steps, it has been proposed to enhance device performance of the transistor elements by increasing the charge carrier mobility in the channel region for a given channel length.

In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive strain, which results in a modified mobility for electrons and holes. For example, creating tensile strain in the channel region increases the mobility of electrons, wherein, depending on the magnitude of the tensile strain, an increase in mobility of up to 20% may be obtained, which in turn directly translates into a corresponding increase in the conductivity. On the other hand, compressive stress in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress.

Although the transistor performance may be considerably enhanced by the introduction of stress-creating layers in or below the channel region, significant efforts have to be made to implement the formation of corresponding stress layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Another promising approach is the creation of stress in the insulating layer, which is formed after the formation of the transistor elements to embed the transistors and which receives metal contacts to provide the electrical connection to the drain/source regions and the gate electrode of the transistors. Typically, this insulation layer comprises at least one etch stop layer or liner and a further dielectric layer that may be selectively etched with respect to the etch stop layer or liner. In the following, this insulation layer will be referred to as contact layer and the corresponding etch stop layer will be denoted as contact liner layer. In order to obtain an efficient stress transfer mechanism to the channel region of the transistor for creating strain therein, the contact liner layer, that is located in the vicinity of the channel region, has to be positioned closely to the channel region. In advanced transistor architectures, a triple spacer approach is required in order to achieve the highly complex lateral dopant profile mentioned above.

A conventional approach for the formation of a semiconductor structure including at least an NMOS transistor and a PMOS transistor with a stressed contact liner layer will be explained in more detail with reference to FIGS. 1a-1e.

FIG. 1a schematically illustrates a cross-sectional view of a semiconductor device 100 in a certain manufacturing stage for forming stress-inducing layers above the NMOS transistor 102 and the PMOS transistor 101, which may be formed on a substrate 103 comprising a semiconductor layer 105 and an appropriate buried insulating layer 104 if a silicon-on-insulator (SOI) configuration is considered. For both the transistor elements 101 and 102, a triple spacer structure has been completed, consisting of the spacer elements 106, 107 and 108 and respective liner materials 114, 115, acting as etch stop layer during the formation of the spacer elements 106, 107 and 108.

FIG. 1b illustrates the semiconductor device 100 when exposed to a photolithographic process so as to protect the PMOS transistor 101 with a mask 109 during the following final implantation of N-dopants 110. FIG. 1c schematically illustrates the device 100 when the NMOS transistor 102 is protected and the semiconductor device 100 is exposed to a final implantation of P-dopants 111.

FIG. 1d schematically shows the semiconductor device 100 with self-aligned silicided regions 112 after the implantation of the P and N dopants. The extension of the silicided regions is determined by the width of the spacers 106, 107, 108.

Finally, FIG. 1e schematically shows the deposition of the stressed contact liner layer 113 on the PMOS and NMOS transistors in order to increase the stress in the channel regions.

This conventional approach, however, presents a number of disadvantages in that a significant amount of the stress of the contact liner layer 113 is "absorbed" by the spacers, thereby making conventional triple spacer approaches currently less attractive for creating strain in channel regions of advanced transistors.

In order to overcome the above-mentioned disadvantages due to the triple spacer structure, it has been proposed to remove the outer spacers, which are typically made of silicon nitride, at the same time for both transistor types by using, for example, SiN-to-oxide selective chemistry, such as hot phosphoric acid. The removal of the outer spacer element 106, although advantageous in view of enhancing the stress transfer from the stressed layer 113 and reducing the series resistance of the transistors due to the reduced distance of the silicide regions from the channel regions, may result in severe modifications of other circuit elements. One important circuit element is a substrate diode that is used for sensing applications in advanced SOI devices, for instance in view of the thermal management in complex devices.

For this purpose, the diode characteristic of the substrate diode is used for evaluating the thermal conditions. The substrate diode is typically formed in the substrate below the buried oxide layer by providing an opening in the actual silicon layer in which the transistors are formed, wherein the opening extends through the buried oxide to expose the substrate. In order to provide a high degree of process compatibility with standard CMOS techniques, the diode structure in the substrate and the transistors in the "active" silicon layer are formed in a common process sequence. Hence, a variation in the process flow in view of enhancing transistor performance will also affect the substrate diode. For example, the substrate diode may typically be formed in an N-well, that is, the substrate diode is formed according to the process corresponding to the manufacturing sequence of P-type transistors. The removal of spacer elements at the transistor level for reducing silicide spacing and positioning stressed material closer to the channel region therefore also affects the PN junctions in substrate diode, due to the reduced distance of the respective silicide in the substrate, which may result in significantly different diode characteristics or even a shortage of the diode structure.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that involves the formation of a stressed contact liner layer close to the channel region of transistor elements, therefore improving the stress transfer from the contact liner layer to the channel region in a semiconductor structure. This may be achieved by providing a semiconductor structure with a differential spacer structure, which in one aspect may be accomplished by a wet chemical etch process.

One illustrative method disclosed herein for differential spacer removal comprises depositing an etch stop layer over a semiconductor microstructure including at least an NMOS element and a PMOS element and removing at least one spacer element from the at least one NMOS element having more than one spacer element by a wet chemical etch process, while at least a PMOS element is protected by the etch stop layer.

Another illustrative method disclosed herein for differential spacer removal from a semiconductor microstructure with more than one MOS transistor and more than one spacer element comprises depositing an etch stop layer over the semiconductor microstructure, implanting N-dopants, removing part of the etch stop layer by a dry etch process, removing at least a spacer element by a wet chemical etch process and depositing a stressed capping layer on the semiconductor microstructure.

One illustrative semiconductor microstructure disclosed herein comprises at least an NMOS element and a PMOS element, wherein the NMOS element has a double spacer structure and the PMOS element has a triple spacer structure.

BRIEF DESCRIPTION OF THE DRAWINGS

The disclosure may be understood by reference to the following description taken in conjunction with the accompanying drawings, in which like reference numerals identify like elements, and in which.

Figure 1A:
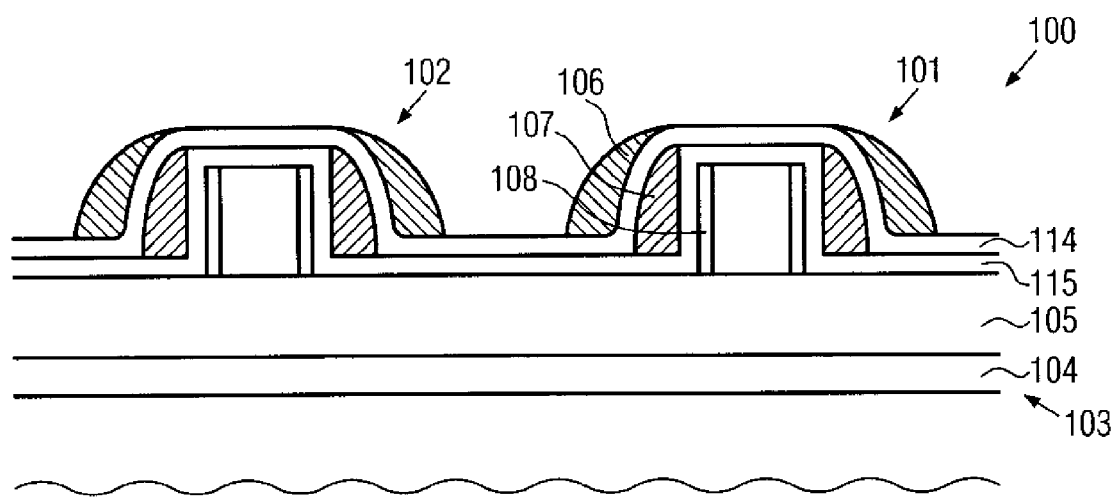
FIGS. 1a-1e schematically illustrate cross-sectional views of a semiconductor structure during various manufacturing stages in forming a stressed contact liner layer according to the state of art.
Figure 1B:
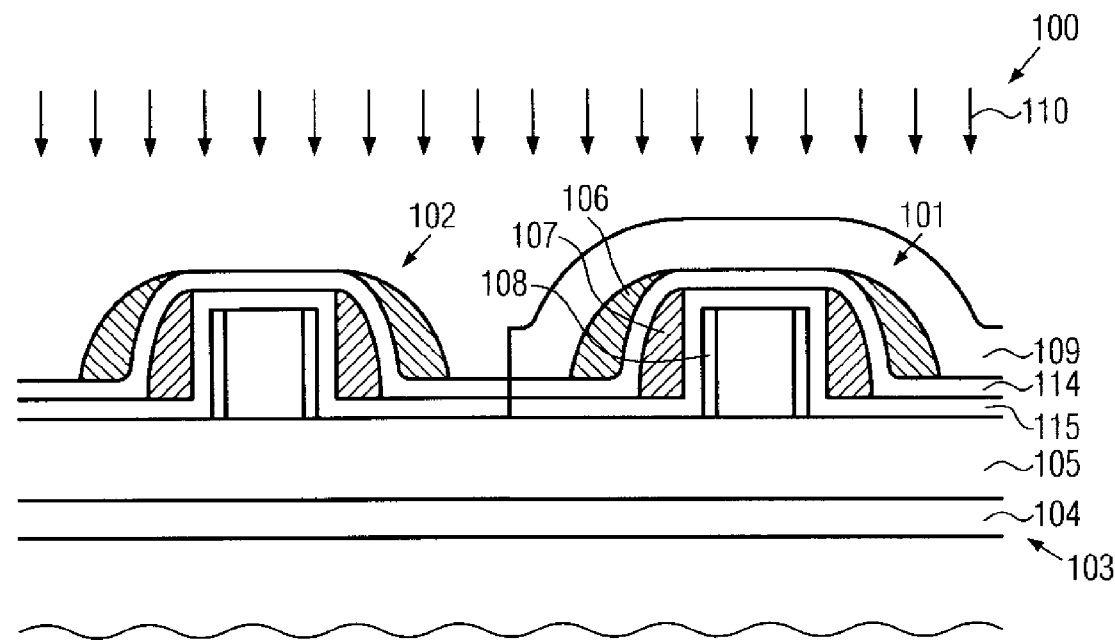
Figure 1C:
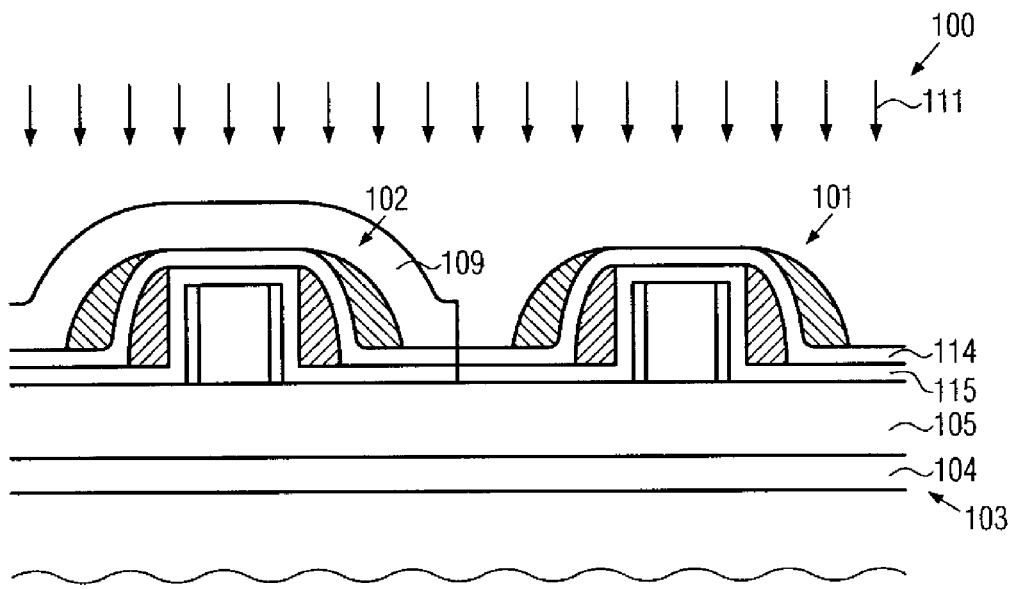
Figure 1D:
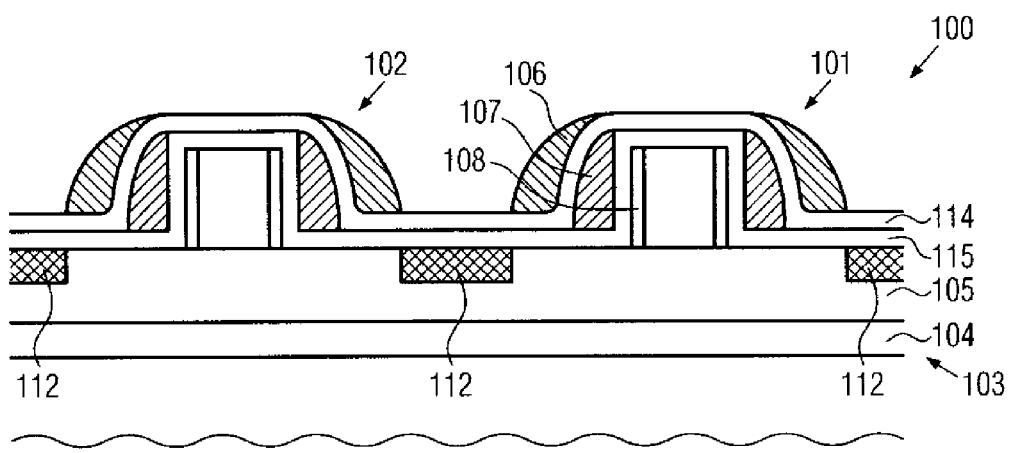

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein addresses the problem of efficiently transferring stress from the stressed contact liner layer to the channel region, while nevertheless maintaining a high degree of compatibility with conventional processes. In order to guarantee a high stress transfer from the contact liner layer to the channel region, it is necessary to place the contact liner layer close to the channel region. The triple spacer scheme, which is typically used in order to produce highly sophisticated dopant profiles in the vertical as well as in the lateral direction in the source and drain regions, has the disadvantage of increasing the distance between the stressed contact liner layer and the channel region, resulting in an absorption of the stress by the spacer elements. The removal of the outermost spacer may improve the stress transfer from the stressed contact liner layer to the channel region. However, this approach may cause problems to the P-type active regions because, if the self-aligned silicide regions are positioned closer to the channel regions of P-type transistors, this could compromise the functionality of the diode structure in the respective substrate diode, as previously explained. For these reasons, a differential spacer removal approach may be used in which the outermost spacer elements are removed only from the one type, such as the NMOS transistors, thus permitting a better stress transfer mechanism to be formed, while the triple spacer structure remains untouched for the other type, such as the PMOS devices. In one aspect, the spacer removal instead is realized by a wet chemical etch process, as for example using hot phosphoric acid, thereby maintaining a high degree of integrity of the transistor areas exposed to wet chemical ambient due to its superior etch selectivity.

FIGS. 2a-2h schematically show a semiconductor device 200 in a cross-sectional view. The semiconductor device 200 comprises a substrate 203 which may represent any appropriate substrate for the formation of the circuit elements of integrated circuits. For example, the substrate 203 may represent a silicon-on-insulator (SOI) substrate including an appropriate buried insulating layer 230, or any other appropriate substrate having formed thereon a crystalline semiconductor layer that is appropriate for the formation of transistor elements therein. Formed in and on the substrate 203 are transistor elements 201, 202 in an intermediate manufacturing stage, wherein the transistor element 201 is a PMOS and the transistor element 202 is an NMOS. The transistor elements contain a gate electrode 210 that is formed on a gate insulation layer 211, which separates the gate electrode 210 from the channel region 212 that may represent a portion of the substrate 203 or of any appropriate semiconductor layer formed thereon. The transistor elements 201 and 202 can have a gate length, i.e., the horizontal dimension of the gate electrode 210 in FIG. 2a of 100 nm and significantly less, as may be encountered in highly complex silicon-based integrated circuits, such as CPUs, memory chips, ASICs (application specific ICs) and the like. Consequently, the gate insulation layer 211 may have an appropriate thickness that may range from approximately 1.2 nm or even less to several nm, depending on the overall dimension of the gate electrode 210. It should be appreciated that the subject matter disclosed herein is highly advantageous in combination with extremely scaled transistor elements having a gate length of approximately 100 nm or even of approximately 50 nm and less, whereas, in principle, the subject matter disclosed herein may also be readily applied to less sophisticated transistor elements.

The semiconductor device 200 further comprises an offset spacer 208 formed on the sidewalls of the gate electrode 210. The offset spacer 208 may be comprised of any appropriate dielectric material, such as silicon dioxide, silicon nitride, silicon oxynitride and the like. A width of the offset spacer 208 is selected in accordance with process requirements for forming the lateral dopant profile of extension regions 213 formed within the substrate 203 adjacent to the channel region 212. The semiconductor device 200 may further comprise an inner spacer element 207 formed adjacent or near the sidewalls of the gate electrode 210, wherein the inner spacer element 207 may be separated from the offset spacer 208 by a liner 214 that is comprised of a dielectric material having a moderately high etch selectivity with respect to the material of the inner spacer 207. In one illustrative embodiment, the inner spacer 207 may be comprised of silicon nitride and the liner 214, which is also formed on horizontal portions of the substrate 203 and on top of the gate electrode 210, may be comprised of silicon dioxide. For such a material composition, a plurality of well-established anisotropic etch recipes with high etch selectivity are known. In other embodiments, the inner spacer 207 may be comprised of silicon dioxide or silicon oxynitride, while the liner 214 may be comprised of silicon nitride so as to again exhibit a moderately high etch selectivity with respect to well-established anisotropic etch recipes. The device 200 may further comprise an outer spacer element 206 having a width that is selected to meet the process requirements for an ion implantation process to be performed subsequently to form deep drain and source regions adjacent to the extension regions 213. The outer spacer element 206 is separated from the inner spacer 207 by an etch stop layer 215, which also covers horizontal portions of the liner 214 and which is comprised of a material exhibiting a moderately high etch selectivity with respect to the material of the outer spacer 206. In one illustrative embodiment, the outer spacer 206 may be comprised of silicon dioxide, whereas the etch stop layer 215 may be comprised of silicon nitride. In other embodiments, different material compositions for the outer spacer 206 and the etch stop layer 215 may be provided, as long as the required etch selectivity between the two materials is maintained. For example, in one embodiment, the outer spacer 206 may be comprised of silicon nitride, whereas the etch stop layer 215 may be comprised of silicon dioxide.

Figure 2A:
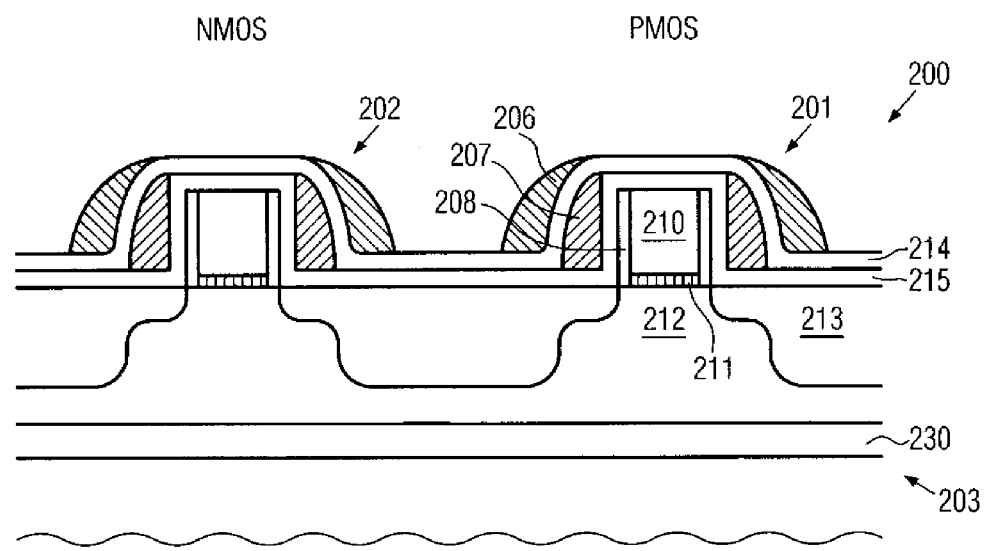
FIGS. 2a-2h schematically illustrate cross-sectional views of a semiconductor structure during various manufacturing stages in forming a differential spacer structure and a contact liner layer close to the channel region in accordance with illustrative embodiments disclosed herein.
Figure 2B:
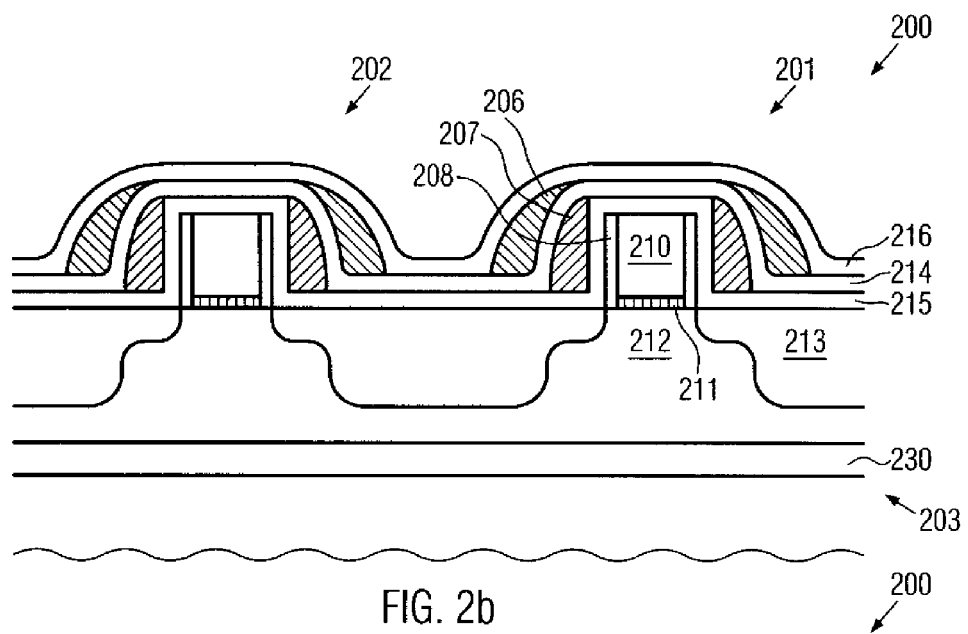

A typical process flow for the differential spacer removal according to a preferred embodiment will be described with reference to FIGS. 2a-2h. FIG. 2a schematically shows the semiconductor device 200 when the formation of the triple spacer structure is already completed and the doping of the P regions has already been performed. First, a thin oxide liner 216 is deposited on the semiconductor structure as shown in FIG. 2b. For this purpose, well-established chemical vapor deposition (CVD) techniques may be used.

Figure 2C:
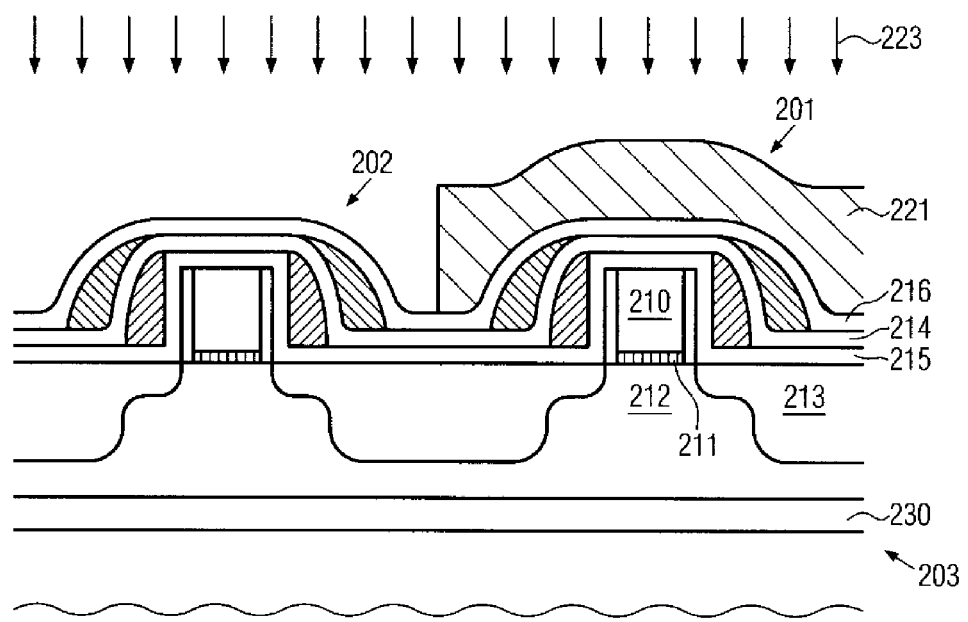

After the deposition of the oxide liner layer 216, a resist material 221 is deposited on its surface and the semiconductor structure 200 is exposed to a photolithographic process to pattern the resist material 221, i.e., to eliminate the resist 221 from above the NMOS transistor 202, as shown in FIG. 2c. The NMOS transistor 202 is then ready for the final implantation of N-dopants 223 as shown in FIG. 2c. During the N-dopant implantation process 223, the energy of the dopant may be adjusted in order to take into account the thickness of the deposited oxide liner layer 216. According to one embodiment, the implantation of N-dopants is performed after the implantation of P-dopants, contrary to what is normally done in the state of art.

Figure 2D:
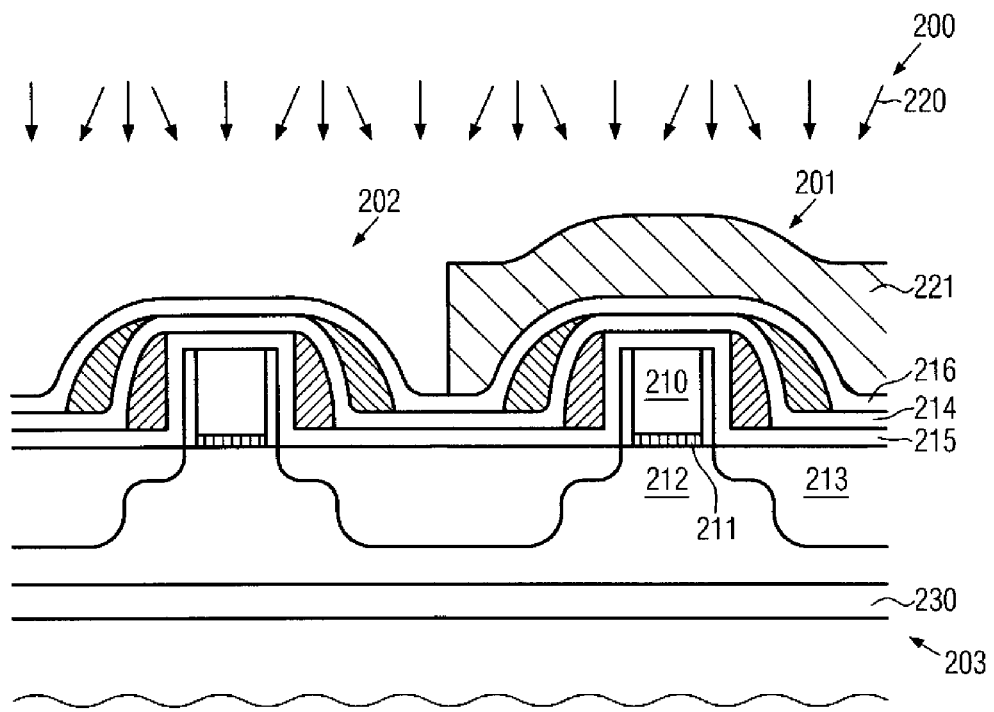
Figure 2E:
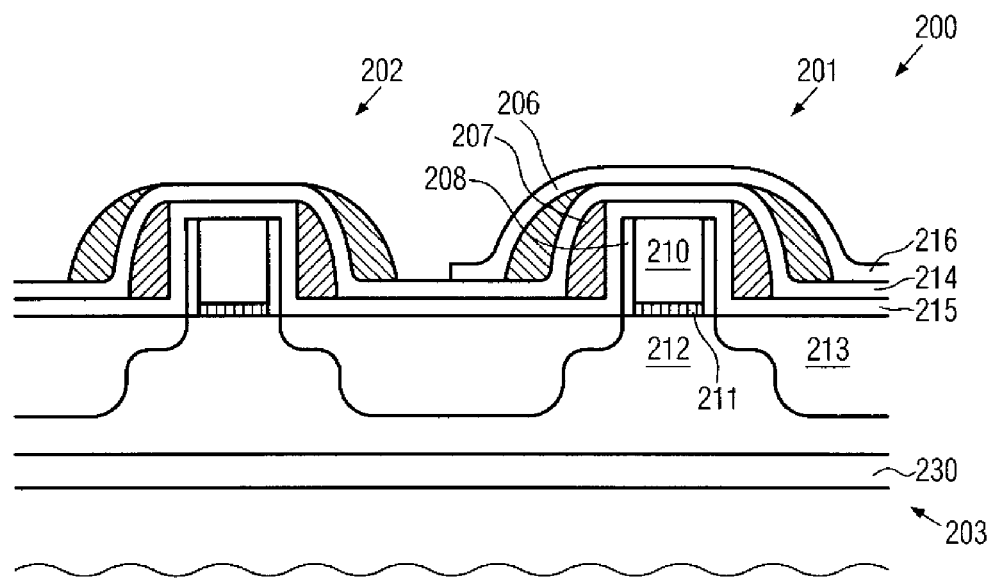

After the final implantation of the N-dopants, the oxide liner layer 216 has to be removed from the NMOS element 202. This is done by employing dry etch techniques, which are selective to nitride and silicon, as shown in FIG. 2d, where the dry etch process is referred to as 220. In the subsequent step, as shown schematically in FIG. 2e, the remaining resist 221 on the PMOS 201 is removed and the semiconductor structure 200 is cleaned. The oxide liner 216 remains on the PMOS element 201. The structure is now ready for the removal of the outermost spacer 206 of the NMOS element 202.

Figure 2F:
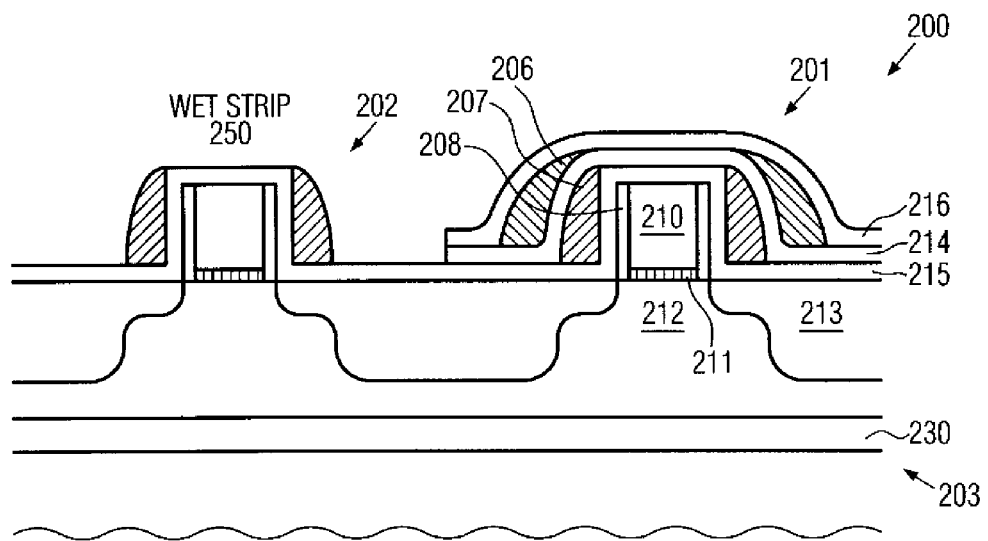

In FIG. 2f, the semiconductor structure 200 is exposed to a schematically depicted wet chemical etch process 250. The etch process has a high SiN-to-oxide selective chemistry and hot phosphoric acid can be used for this purpose. The PMOS element 201 is protected during the wet chemical etch process by the oxide liner layer 216, therefore, it is substantially not influenced by the wet chemical etch process.

Figure 2G:
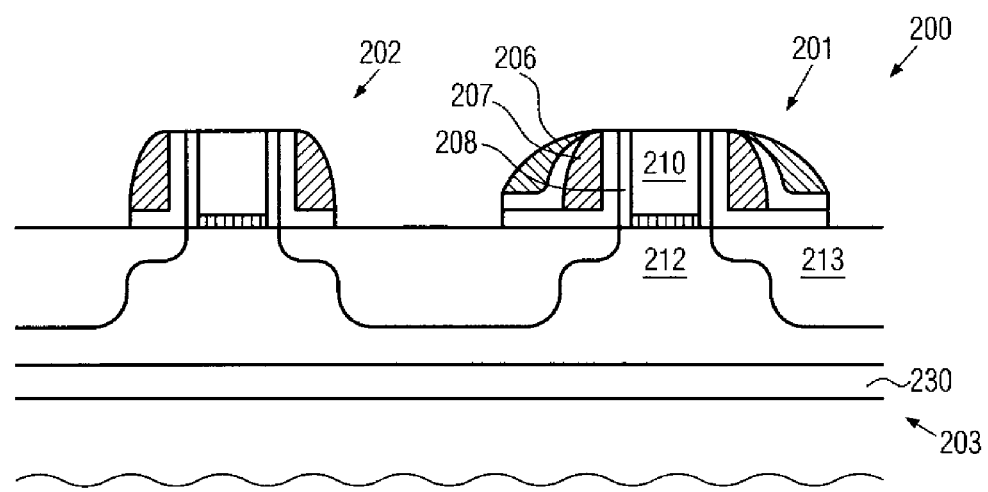

After the removal of the outermost spacer 206 of the NMOS structure 202, the protective oxide liner layer 216 on the PMOS structure 201 and other oxide residuals or contaminants on the surface may be removed prior to the deposition of any appropriate metal, therefore, a pre-clean process may be performed. This can be achieved using well-established etch processes with an oxide-to-SiN selective chemistry as, for example, fluoric acid (HF), which can remove oxide and oxide residues selectively to silicon and silicon nitride. FIG. 2g schematically shows the semiconductor structure 200 with a double spacer structure for the NMOS transistor 202 and a triple spacer structure 206, 207, 208 for the PMOS transistor 201.

After the differential spacer structure on transistors 201, 202 is realized, it is possible to proceed with the silicidation process of the source and drain regions. In highly advanced transistor elements, usually the conductivity of highly-doped regions, such as the gate electrode and contact areas of the drain/source regions, is increased by providing a metal compound on upper portions of these regions, since a metal-silicon compound may have a higher conductivity compared to an even highly doped silicon material. For example, titanium, cobalt, nickel and the like is typically provided to form corresponding metal silicide regions of reduced resistivity.

Figure 2H:
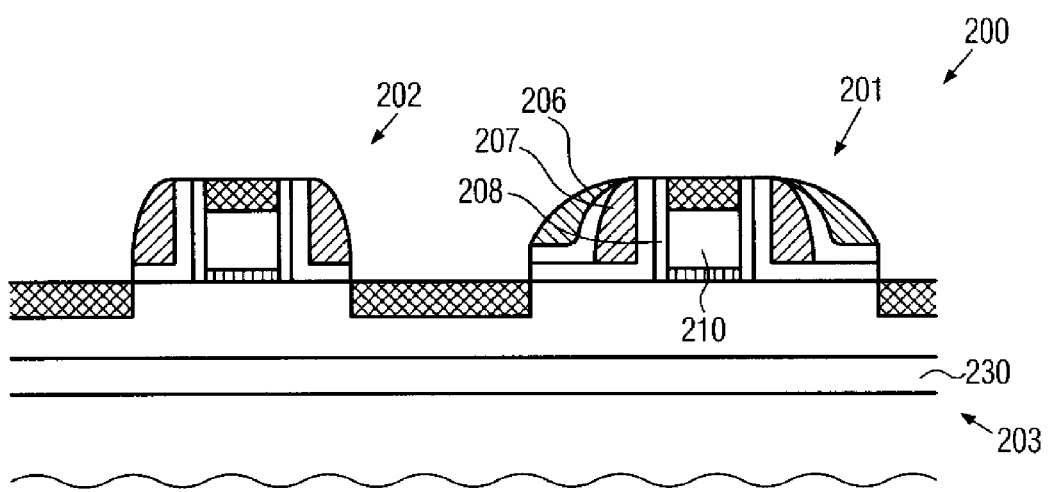

The silicidation process is schematically shown in FIG. 2h. In one embodiment, nickel silicidation of the source and drain regions is performed. The silicidation layer reaches close to the channel region for the NMOS transistor, while it is further away for the PMOS transistor. Silicidation layers are also formed on the top of the electrode gates. Thus, any negative effect on a corresponding substrate diode (not shown) when formed together with P-channel transistors may be substantially avoided.

Figure 1E:
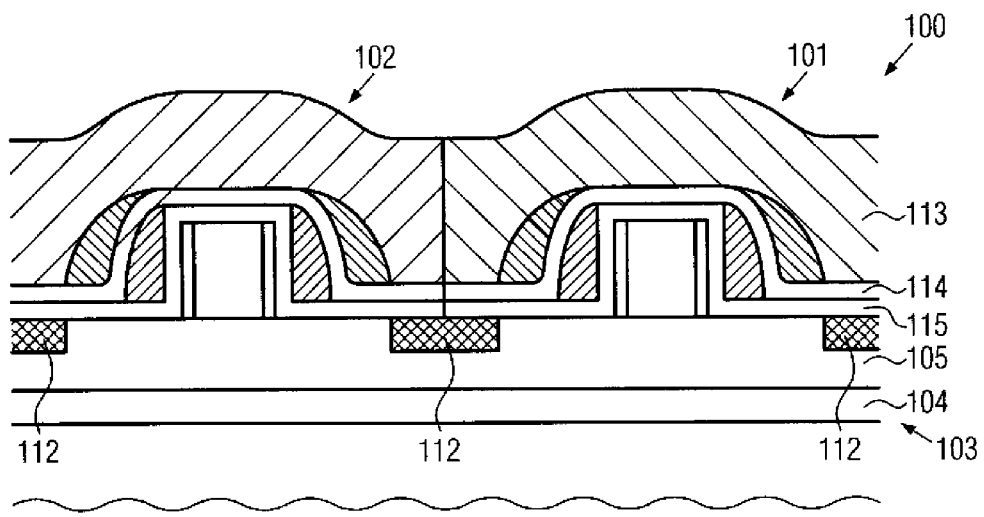

The semiconductor structure 200 is now ready for the deposition of a stressed contact liner layer over the NMOS structure 202 and PMOS structure 201. The deposition of the stressed contact liner layer is similar to the deposition of layer 113, as shown in FIG. 1e. The contact liner layer may be formed as separated layers having different stress characteristics. The mobility of the electrons in NMOS transistors may be improved by tensile stress, while the mobility of holes in PMOS transistors may be improved by compressive stress. In one embodiment, the contact liner layer is made of silicon nitride. As is well known, the deposition parameters, such as pressure, temperature, bias voltage and the like, during a plasma enhanced chemical vapor deposition (PECVD) process for depositing silicon nitride may be selected so as to obtain a specified internal stress ranging from approximately 1 GPa (Giga Pascal) or higher of tensile stress to approximately 2 GPa or higher of compressive stress. Consequently, a corresponding internal stress may be selected so as to efficiently produce a corresponding strain in the channel region, which may finally lead to an enhanced transistor operation. Moreover, since the process parameters of the PECVD process may be selected so as to obtain a highly non-directional deposition behavior, any other etch region that may have been formed may also be filled, at least partially, to substantially avoid any voids within the dielectric material enclosing the transistor elements. In other embodiments, the stressed liners may be formed of any other dielectric materials providing the desired stress levels.

A particular embodiment relates to a semiconductor structure comprising at least a NMOS transistor and a PMOS transistor, wherein the number of spacer elements for each transistor is not the same. In one embodiment, the NMOS transistor 202 comprises a double spacer structure, while the PMOS transistor 201 comprises a triple spacer structure 206, 207, 208. In one embodiment, the semiconductor structure may comprise a larger or lower number of spacers as mentioned above depending on complexity of source and drain structures. In a further embodiment, the number of spacers of the NMOS element is larger than the number of spacers of the PMOS element of the semiconductor structure disclosed herein, when, for instance, respective substrate diodes may be provided in P-wells. According to one embodiment, the implantation of N-dopants can be performed before the implantation of P-dopants.

As a result, the embodiments disclosed herein provide an improved technique for transferring stress from a contact liner layer to the channel region of transistor elements, wherein removing, by wet chemical etch process, the outer spacer elements of a transistor of a semiconductor structure, close proximity of the contact liner layer to a channel region is accomplished. The method is particularly suited for transistor elements with a gate electrode of 100 nm and significantly less and it is suited for the removal of outer spacer elements of an NMOS transistor. The method and the semiconductor structure described herein have a number of advantages with respect to the state of art. In particular, an increased stress transfer from the contact liner layer to the channel region and a reduced series resistance is obtained. The method described herein has a high compatibility with conventional process flows. The employment of a wet chemical etch process does not substantially deteriorate the elements which are already present on the semiconductor structure. Moreover, the elimination of the outer spacer elements increases the space available for electrical contacts.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for differential spacer removal, comprising:
   depositing an etch stop layer over a semiconductor microstructure including at least an NMOS element and a PMOS element, each of said NMOS element and said PMOS element comprising a plurality of spacer elements, wherein each plurality of spacer elements comprises an outer spacer element, and the etch stop layer contacts and covers said outer spacer elements of said pluralities of spacer elements;
   implanting N-dopants through the previously deposited etch stop layer;
   removing a first portion of said etch stop layer covering said outer spacer element of said at least one NMOS element while leaving a second portion of said etch stop layer in place over said outer spacer element of said at least one PMOS element; and
   removing at least said outer spacer element from a sidewall of said at least one NMOS element after removing said first portion by performing a wet chemical etch process, while said outer spacer element of said PMOS element is protected from the wet chemical etch process by the etch stop layer.

2. The method of claim 1, wherein the NMOS and PMOS elements of the semiconductor microstructure each comprise a triple spacer scheme.

3. The method of claim 1, wherein the removed spacer element is made of silicon nitride.

4. The method of claim 1, wherein, for the wet chemical etch process, hot phosphoric acid is used.

5. The method of claim 1, further comprising removing the first portion of said etch stop layer from over the NMOS element by performing a dry etch process using a resist mask formed over the PMOS element.

6. The method of claim 5, further comprising removing the resist mask from over the PMOS element and cleaning the semiconductor microstructure.

7. The method of claim 6, further comprising removing the etch stop layer from over the plurality of spacers of the PMOS element.

8. The method of claim 7, further comprising performing a self-aligned silicidation process to form silicide material.

9. The method of claim 8, further comprising depositing a stressed nitride capping layer on the semiconductor structure.

10. A method for differential spacer removal from a semiconductor microstructure with an NMOS and a PMOS transistor, each of which comprise a plurality of spacer elements, the method comprising:
    depositing an etch stop layer over the semiconductor microstructure, wherein the etch stop layer covers an outer spacer element of each of the pluralities of spacer elements;
    implanting N-dopants through the etch stop layer;
    removing a first portion of said etch stop layer covering said outer spacer element of said NMOS transistor by performing a dry etch process while leaving a second portion of said etch stop layer in place over said outer spacer element of said PMOS transistor;
    removing at least said outer spacer element from a sidewall of said NMOS transistor after removing said first portion by performing a wet chemical etch process; and
    depositing a stressed capping layer on the semiconductor microstructure.

11. The method of claim 10, wherein the semiconductor microstructure includes at least an NMOS element and a PMOS element.

12. The method of claim 11, wherein removing said part of the etch stop layer comprises forming a resist layer over the PMOS element and the NMOS element and removing the resist layer from over the NMOS element.

13. The method of claim 11, wherein the etch stop layer is removed from the NMOS element using the dry etch process, and the etch stop layer is removed from above the plurality of spacers of the PMOS element after removing the at least one spacer element from the NMOS element.

* * * * *